July 2, 1957
B. PARZEN
2,798,159
MEANS FOR STABILIZING FREQUENCY
Filed Dec. 29, 1953
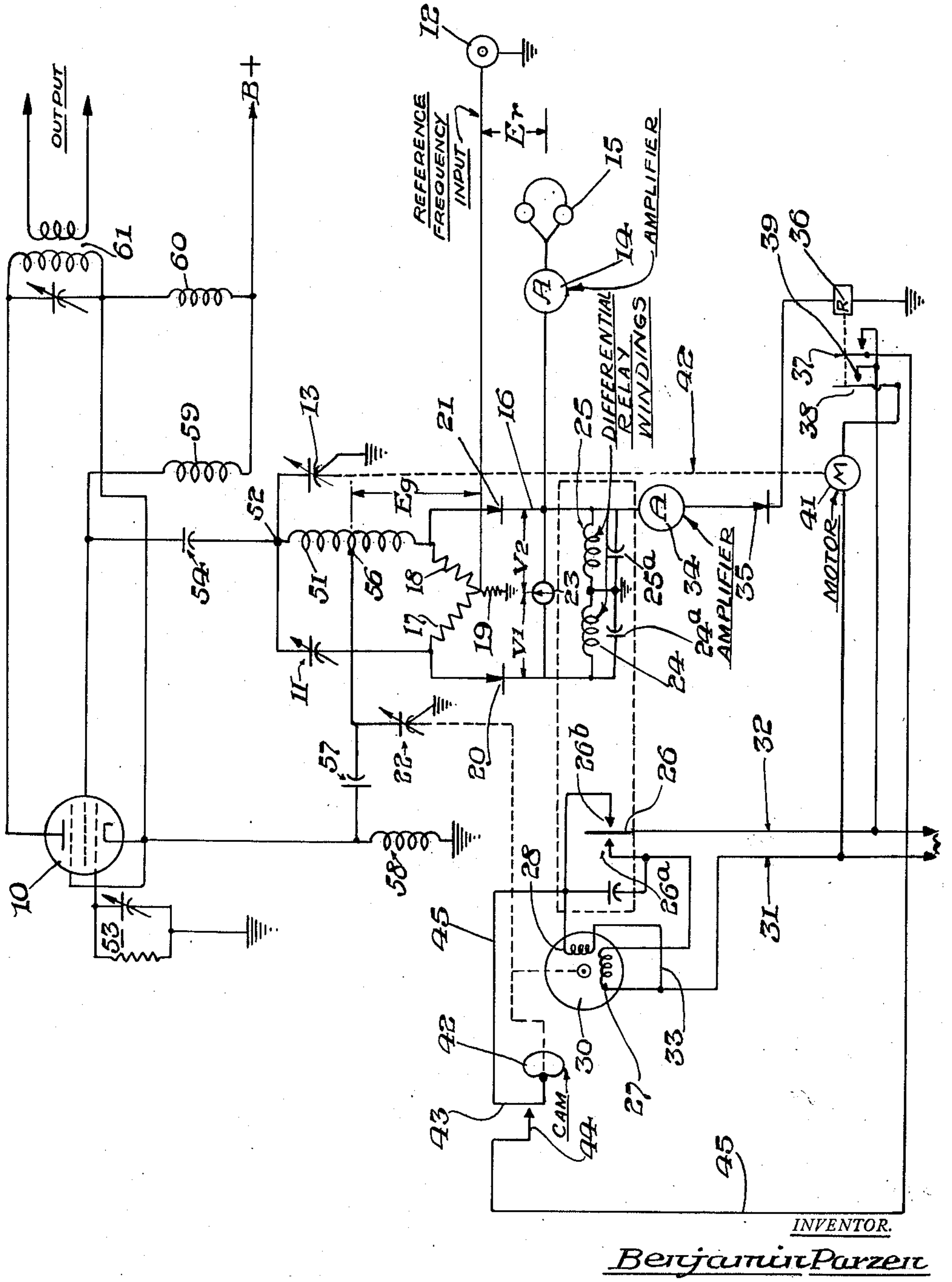
INVENTOR.
Benjamin Parzen
BY Darby & Darby
HIS ATTORNEYS United States Patent Office 2,798,159

Patented July 2, 1957

2,798,159

MEANS FOR STABILIZING FREQUENCY

Benjamin Parzen, Woodside, N. Y., assignor to Olympic Radio & Television Inc., Long Island City, N. Y., a corporation of New York Application December 29, 1953, Serial No. 400,977

12 Claims. (Cl. 250—36)

The present invention relates to frequency stabilizing means for radio transmitters and oscillators and particularly adapted for stabilizing of transmitters of the controlled power oscillator type.

More particularly still the invention relates to a frequency stabilizing arrangement wherein the controlled oscillator is locked to a source of reference frequency which is normally continuously applied but which may be only periodically applied. For this reason the invention also includes methods of preventing frequency drift of the oscillator which are of particular benefit during those periods when the reference frequency is not applied thereto.

It is an object of the invention to provide a means of stabilizing the frequency of an oscillator, such as a transmitter of the controlled power oscillator type.

It is another object of the invention to provide such a frequency stabilizing control which is of the phase-locked type.

It is yet another object of the invention to provide a means for determining when the controlled oscillator is operating at the center of its synchronizing range and for initially adjusting the oscillator for operation at that point.

It is still another object of the invention to provide such a frequency stabilizing system which serves to lock the oscillator to a reference frequency and which assures that the oscillator have a tendency to retain, during short absences of the reference frequency, a frequency very close to that reference.

It is a further object of the invention to provide such a phase-locked, drift-controlled frequency stabilizing means comprised of a minimum number of components embodied in a simple circuit.

It is a still further object of the invention to provide such a frequency stabilizing means which has a high degree of reliability and dependability.

Yet another object of the invention is to provide a wide-band frequency-insensitive phase discriminator for phase-locked oscillators.

Other objects and features of the invention will be apparent when the following description is considered in connection with the annexed drawing which is a schematic circuit diagram of the invention as illustratively applied to a controlled power oscillator of the Hartley type.

The present invention utilizes a phase-locked system of the type commonly known as oscillator synchronization. In this system a small amount of power at the reference frequency is injected into the grid-cathode circuit of the controlled oscillator. The oscillator is so designed that its free running frequency is close to the reference frequency, and therefore the oscillator will lock to the reference frequency, and will remain locked-in even during changes in operating condition, if of moderate extent. For wider changes of operating conditions, the present system automatically restores the oscillator to a situation where the reference frequency will remain locked-in.

Referring now to the drawing, there is shown therein an oscillator 10 which is illustrated as of the electron-coupled Hartley type although other types of oscillator might be utilized. The main resonant circuit determining the oscillator frequency is composed of a main tuning capacitor 11 and coil 51, connected effectively in parallel with one another by being joined at one end at 52 and connected to ground through respective small resistors 17 and 18 and a common small resistor 19. Junction 52 is coupled to the anode-grid or screen grid of oscillator 10 by way of a coupling capacitor 54, and the control grid is connected to ground through a biasing circuit 53. A tap 56 on coil 51 is coupled to the oscillator cathode through a coupling capacitor 57. Various R. F. chokes 58, 59, 60 provide R. F. isolation and D. C. connection, as desired. A fine tuning capacitor 13 is connected from junction 52 to ground and is effectively in parallel to main tuning capacitor 11. A phase control capacitor 22 is coupled between tap 56 and ground and controls the oscillator output phase. The oscillator output is derived from tuned output transformer 61.

In operation, the main tuning capacitor 11 is set approximately to the reference frequency applied at 12, and the fine tuning capacitor 13 is then adjusted so that the oscillator free-running frequency is close to the reference frequency, at which time the oscillator will come into synchronization with and lock on the reference frequency.

For the purpose of sensing any tendency of the oscillator to break out of step with the reference frequency, such as due to tube aging, temperature changes, or other causes of drift, a discriminator or phase difference measuring circuit is employed that is, a circuit to measure the phase difference between a reference signal and the oscillator output. A rectifier 20 in series with one coil 24 of a differential relay is connected across resistors 17 and 19 in series. Similarly, a rectifier 21 and the other relay coil 25 are connected across resistors 18 and 19 in series. Relay coils 24 and 25 thus form the loads for rectifiers 20 and 21, and are bypassed by suitable capacitors **24*a* and 25*a*. A meter 23 is connected across coils 24 and 25**.

It is evident that when the meter 23 reads zero, voltage $V_1$ across relay coil 24 is equal to voltage $V_2$ across relay coil 25. Since the capacitive current through resistor 17 is substantially 180° out of phase with the inductive current through resistor 18, $V_1$ can equal $V_2$ only when the reference voltage $E_r$ from source 12 is 90° out of phase with both the volt drops across resistors 17 and 18. Consequently, $E_r$ is then in phase with $E_g$, and the oscillator is locked in and is in the center of its synchronizing range.

To set the oscillator at the correct frequency, an amplifier 14 and headphone 15 are connected across one relay coil, such as 25. By adjusting fine tuning condenser 13 to vary the oscillator frequency until the beat frequency between the oscillator frequency and the reference frequency practically disappears, the oscillator can be brought close enough to the reference frequency to lock in, providing a more sensitive indication and initial setting means than meter 23.

It can be theoretically demonstrated and experimentally confirmed that the phase displacement $\phi$ between $E_r$ and $E_g$ is related to the frequency difference $\Delta F$ between the free running frequency $F_r$ of the oscillator and the reference frequency, in accordance with the following equation:

$$\frac{\Delta F}{F_r}=\frac{E_r}{2E_gQ}\sin\phi$$

This equation shows that when $E_g$ and $E_r$ are in phase, so that $\phi=0$, $\Delta F=0$ and the free-running frequency of the oscillator is the same as the reference frequency, and therefore the oscillator is operating in the center of the synchronizing range. It is desirable that the oscillator operate in or near the center of the synchronizing range since then removal or failure of the reference frequency source will result in a minimum change in oscillator frequency. In the circuit as shown in the drawing, the removal of the reference frequency will result in a change of not more than 0.001% in oscillator frequency.

When the circuit has been adjusted as above described, the oscillator will remain in synchronization provided that its free running frequency does not drift to a point outside of the synchronizing range. The equation set forth above indicates that the synchronizing range for a circuit having a Q value of 50 and an $E_r:E_g$ ratio of 0.01 is approximately plus or minus 0.01%. A circuit designed to have this synchronizing range requires that the oscillator free running frequency shall drift not more than 0.01%.

Since such an oscillator is extremely difficult to design, it is desirable to provide a circuit which will correct for oscillator drift. Such a circuit is shown in the drawing, and serves not only to permit an oscillator having greater inherent drift to be utilized, but also assures that the oscillator is always operating at the center of its synchronizing range and provides for a minimum of frequency shift if for any reason the reference frequency is not applied.

The phase detector circuit or discriminator heretofore described provides a means to accomplish oscillator drift correction since the differential voltages $V_1$, $V_2$ may be readily utilized to automatically correct the setting of the phase-adjusting capacitor 22.

One mode of utilizing the discriminator circuit to mechanically correct for oscillator drift is shown in the drawing, and comprises the differential relay connected in the output of rectifiers 20 and 21. This differential relay has windings 24 and 25, an armature 26, and contacts **26*a*, 26*b*, which contacts are arranged as a single-pole double-throw switch. Contact 26*a* is connected through a winding 27 of a reversible motor 30 to one leg 31 of a power source, the other leg 32 of which is coupled to armature 26. A second winding 28 of motor 27 has one terminal coupled to leg 31 and the other to contact 26*b***.

When the phase detector or discriminator is balanced, so that windings 24 and 25 are equally energized, armature 26 will lie between the contacts **26*a* and 26*b* and as a result neither of the two windings 27 and 28 of the motor 30 will be energized. When the discriminator output has a positive value, armature 26 will close against contact 26*a* and a circuit will be completed from the line leg 31, through winding 27, contacts 26*a* and armature 26 to the other leg 32 of the power line. This will cause energization of the motor 30 and rotation thereof in such a direction as to move the movable plate of capacitor 22 to reduce the discriminator output to zero at which time motor 30** will stop.

If, on the other hand, the differential relay is operated to connect its armature 26 with contact **26*b*, as a result of a negative output from the discriminator, a circuit will be established from the side 31 of the line, over conductor 33, through winding 28 of motor 30, thence through contact 26*b* to the other side 32 of the line. Energization of this motor winding 28 will cause rotation of the movable plate of capacitor 22** in the opposite direction until the discriminator output again reaches zero.

The phase control circuit above-described makes it possible to utilize an oscillator which has an uncorrected free-running frequency long-time drift of as much as 0.2%, thereby making it easy and practical to design and construct an oscillator which would otherwise, as has been pointed out, be an extremely difficult problem. Moreover, the utilization of such an automatic means of adjusting the phase-adjusting capacitor 22 assures that the oscillator is maintained with the center of its synchronizing range at the reference frequency, so that even when the reference frequency is interrupted, the oscillator output frequency will still be within 0.001% of the reference frequency.

An additional feature of the circuit of the instant invention consists in providing an automatic control for the fine frequency-adjusting capacitor 13 which can compensate for long-term steady drift in frequency. This automatic control is formed of a low pass amplifier 34 connected in the output of the rectifier 21. The A. C. output of this amplifier is fed through a rectifier 35 and its rectified output operates a relay 36 which is provided with armatures 37, 38 and interconnected contacts 39. A motor 41 is mechanically connected, as indicated by the dotted line 41', to the movable plate of the capacitor 13 and thus serves to rotate the capacitor when energized. Motor 41 is connected in a circuit leading from the side 31 of the power line through the motor 41 to armature 38 of relay 36, thence through contacts 39 to the other side 32 of the power line. As a result, the motor 41 is energized to cause scanning of the capacitor 13 as long as there is an output from the amplifier 34 caused by the beat frequency between the reference and oscillator frequencies. As soon, however, as the free-running frequency of the oscillator comes close to the reference frequency, the oscillator is locked to the reference frequency and there is no longer an output from the amplifier 34. Thus the scanning of the capacitor 13 ceases as soon as the oscillator has locked to the reference frequency.

In addition to performing the function mentioned above, the relay 36 controls the phase control motor 30 so as to set the phase-adjustment capacitor 22 to the center of its operating range whenever the oscillator is not locked in. This is accomplished by mechanically conducting a cam 42 to the shaft of the motor 30 to which the movable plate of the capacitor 22 is also connected. The cam 42 operates an armature 43 of a switch comprising that armature and contact 44, the switch being connected in a circuit which extends from the side 31 of the power line, over conductor 33, through motor winding 28, thence through conductor 45, switch armature 43, contact 44, conductor 45, through armature 37 of relay 36, and contact 39 to the other side 32 of the power line. Switch 43—44 is closed only when the phase-correcting capacitor 22 is displaced from its center position. Therefore, when relay 36 is energized to begin scanning the oscillator frequency preparatory to locking in, motor winding 28 is immediately energized if the phase correction capacitor 22 is off center, and remains energized to rotate capacitor 22 and cam 42 until the cam 42 opens contacts 43, 44. At the same time, as described above, motor 41 is energized to cause rotation or scanning of the capacitor 13, until the oscillator frequency is locked to the reference frequency.

Immediately upon deenergization of relay 36 the normal automatic phase control circuit comprising the differential relay and motor 30 goes into operation and maintains the proper phase relationship.

In initiating operation, the main tuning capacitor is adjusted manually to the approximate frequency, as may be shown by a suitable calibrated dial. If within about 1%, the system will automatically adjust the fine tuning capacitor and set the phase capacitor to center the oscillator frequency in its synchronizing range.

In some cases, where manual adjustment is desired, phase capacitor may center the oscillator by adjustment until meter 23 reads zero. Fine tuning capacitor 13 may be manually adjusted to produce synchronism, by adjusting until the beat frequency in earphones 15 disappear.

Of course, the centering means may be omitted when desired, as may be the automatic fine tuning and drift-correcting system comprising motor 41 and its control.

The present invention thus provides a triple control for the oscillator, to maintain it locked to the reference frequency. For variations of less than 0.001% the normal phase-locked situation prevails. Should the oscillator tend to vary more widely than this, then for variations of ±0.01%, the phase control system comprising the differential relay and motor 30 take charge to adjust capacitor 22 to compensate for any change or drift. Since the adjustment of capacitor 22 produces only phase correction, the oscillator frequency is maintained essentially at the reference frequency, and no beat frequency results. Should the oscillator frequency tend to drift more widely, so as to break the locked-in condition, then the resultant beat frequency will energize relay 36 to scan fine tuning capacitor 13 to restore proper lock-in frequency and at the same time recenter phase control capacitor 22.

Since any such drifts can be made quite slow by established techniques, should the reference frequency be interrupted at any time, the oscillator frequency will then be within 0.001% of the reference frequency, which will be maintained for some time, depending upon the rate of drift. The present system therefore lends itself to intermittent application of the reference frequency, which can thus sequentially control a large number of controlled oscillators. For example, the reference frequency need be applied to each controlled oscillator only for a few minutes each hour, enough to assure complete cancellation of any drift during the preceding hour.

While mechanical control of capacitors has been shown, it will be understood that the invention is just as readily applicable to electronic control of capacitance, as by reactance tubes. Also, while the illustrated discriminator is especially desirable and effective, other forms of discriminator may also be used. Similarly, other forms of motor control may be utilized as desired.

It will be especially noted that the relay 36 is responsive only to frequency difference between the oscillator and reference frequencies, and other forms of circuit for deriving such frequency difference may be employed, as desired. However, the one shown has particular advantage in that it utilizes the pre-existing rectifier 21 which forms part of the discriminator and hence simultaneously serves two functions, in the discriminator and as the difference frequency producer.

Accordingly, the above description is to be deemed illustrative only, and the invention defined solely by the appended claims.

What is claimed is:

1. A phase-locked drift-corrected controlled oscillator system, comprising an oscillator having a frequency-determining capacitance and a frequency-determining inductance with a common terminal; and a tube having a screen grid, a cathode and a control grid, said cathode being coupled to a tap on said inductance, said grid being grounded for alternating current and said screen grid being coupled to said common terminal, a phase discriminator comprising a first resistor in series with said capacitance, a second resistor in series with said inductance, said resistors having a common junction, a third resistor between said junction and ground, a differential relay having first and second opposed windings, a movable armature and two fixed contacts in single-pole double-throw relation, a first rectifier in series with said first winding and across said first and third resistors, a second rectifier in series with said second winding and across said second and third resistors; said oscillator having a phase-correcting variable capacitor, a reversible motor having first and second motor windings connected respectively to said relay contacts, a source of power connected between said relay armature and said motor windings, said phase-correcting capacitor being coupled to said motor to be driven thereby, means supplying a reference frequency signal across said third resistor whereby upon phase shift between said oscillator output and reference signal, said differential relay will energize said motor in a sense to restore said output and signal to their original phase relation.

2. A system as in claim 1, further including a fine tuning capacitor coupled to said frequency-determining capacitor to vary said oscillator frequency, a further relay coupled to one of said rectifiers and responsive to the beat frequency between said oscillator and reference frequencies, a further motor coupled to said fine tuning capacitor, said further relay being coupled to said further motor for energizing said further motor so long as said beat frequency exists whereby said further motor and fine tuning capacitor serve to compensate said oscillator for drift.

3. A system as in claim 1, further including a cam coupled to said first motor, a switch operated by said cam whenever said phase-correcting capacitor departs from its center position, a circuit responsive to said further relay for energizing said first motor to vary said phase-correcting capacitor simultaneously with said further motor and so long as either said phase-correcting capacitor remains away from its center position or said further motor is energized, whereby, upon restoring said oscillator to synchronism with said reference frequency, said phase-correcting capacitor is restored to its center position.

4. An injection phase-locked drift-corrected controlled oscillator system, comprising an oscillator having a frequency-determining circuit, said oscillator having a phase-correcting variable capacitor, and a fine tuning capacitor, a phase measuring circuit comprising a first resistor and a second resistor, said resistors being connected to the frequency determining circuit of the oscillator, said resistors having a common junction, and being excited from said frequency-determining circuit in out-of-phase relation, a third resistor between said junction and ground, means supplying a reference frequency signal across said third resistor to lock in said oscillator when said oscillator has a frequency within synchronizing range of said reference frequency, said phase measuring circuit also having first and second rectifiers, a balanced load having a pair of terminals connected through respective ones of said rectifiers across said first and second resistors, a reversible motor coupled to said capacitor, means coupling said motor to said load to vary said capacitor in accordance with phase shift between said oscillator output and said reference signal to reduce said phase shift, a fine tuning capacitor coupled to said circuit to vary said oscillator frequency, a further motor coupled to said fine tuning capacitor, means energizing said further motor in response to a beat frequency between said oscillator and reference frequencies and interrupting said energization upon cessation of said beat frequency.

5. A system as in claim 4, further including a cam coupled to said reversible motor, a switch operated by said cam whenever said phase-correcting capacitor departs from its center position, a circuit responsive to said further relay for energizing said reversible motor to vary said phase-correcting capacitor simultaneously with said further motor and so long as both said phase-correcting capacitor remains away from its center position and said further motor is energized whereby, upon restoring said oscillator to synchronism with said reference frequency, said phase-correcting capacitor is restored to its center position.

6. An injection phase-locked drift-corrected controlled oscillator system, comprising an oscillator having a frequency-determining circuit, said oscillator having a phase-correcting variable capacitor, and a fine tuning capacitor, means injecting a reference frequency signal into said oscillator system to lock in said oscillator when within synchronizing range of said reference frequency, a phase discriminator, means supplying said oscillator output and said reference frequency to said phase discriminator to derive a reversible discriminator output signal representative of the magnitude and sense of phase difference therebetween, motor means actuating said phase-correcting capacitor in response to said discriminator signal to reduce said phase shift, and means responsive to occurrence of a beat frequency between said oscillator and reference frequencies for varying said fine tuning capacitor.

7. A system as in claim 6, further including means operative simultaneously with said last means for restoring said phase-correcting capacitor to center position.

8. An injection phase-locked drift-corrected controlled oscillator system, comprising an oscillator having a frequency-determining circuit, said oscillator having a phase correcting variable reactance and a fine tuning reactance, means injecting a reference frequency signal into said oscillator system to phase lock in said oscillator on each cycle when within synchronizing range of said reference frequency, a phase measuring circuit, means supplying said oscillator output and said reference frequency to said phase measuring circuit to derive an output signal representative of the magnitude and sense of phase difference therebetween, means for varying said phase-correcting reactance in response to said output signal to reduce said phase shift, and means responsive to occurrence of a beat frequency between said oscillator and reference frequencies for varying said fine tuning reactance.

9. A system as in claim 8, further including means operated simultaneously with said last means for restoring said phase-correcting reactance to a center value.

10. An injection phase-locked drift-corrected controlled oscillator system, comprising an oscillator having a frequency-determining circuit, said oscillator having a phase-correcting variable frequency determining element, means injecting a reference frequency signal into said oscillator system to lock said oscillator when within synchronizing range of said reference frequency, a phase measuring circuit, means supplying said oscillator output and said reference frequency to said phase measuring circuit to derive a reversible output signal representative of the magnitude and sense of phase difference therebetween and motor means actuating said phase-correcting variable frequency determining element in response to said phase measuring output signal to reduce said phase shift.

11. An injection phase-locked drift-corrected controlled oscillator system, comprising an oscillator having a frequency-determining circuit, said oscillator having a phase-correcting variable frequency determining element, a fine tuning element, means injecting a reference frequency signal into said oscillator system to lock said oscillator when within synchronizing range of said reference frequency, a phase measuring circuit, means supplying said oscillator output and said reference frequency to said phase measuring circuit to derive a reversible output signal representative of the magnitude and sense of phase difference therebetween, motor means actuating said phase-correcting variable frequency determining element in response to said phase measuring output signal to reduce said phase shift, and means responsive to occurrence of a beat frequency between said oscillator output and reference frequencies for varying said fine tuning element.

12. An injection phase-locked drift-corrected controlled oscillator system comprising an oscillator having a frequency determining circuit, said circuit having a phase-correcting variable reactance, means injecting a reference frequency signal into said oscillator system to phase lock said oscillator on each cycle when within synchronizing range of said reference frequency, a phase-measuring circuit, means supplying said oscillator output and said reference frequency to said phase-measuring circuit to derive an output signal representative of the magnitude and sense of phase difference therebetween, and means for varying said phase-correcting reactance in response to said output signal to reduce said phase shift.

References Cited in the file of this patent

UNITED STATES PATENTS

| | | |
|---|---|---|
| 2,044,749 | Usselman | June 16, 1936 |
| 2,104,801 | Hansell | Jan. 11, 1938 |
| 2,358,454 | Goldstine | Sept. 19, 1944 |
| 2,415,799 | Reifel et al. | Feb. 11, 1947 |
| 2,436,307 | Kinn et al. | Feb. 17, 1948 |